(12) United States Patent
Doerrer et al.

(10) Patent No.: US 6,980,139 B2
(45) Date of Patent: Dec. 27, 2005

(54) SIGMA-DELTA-MODULATOR

(75) Inventors: Lukas Doerrer, Villach (AT); Antonio Digiandomenico, Villach (AT); Andreas Wiesbauer, Portschach (AT)

(73) Assignee: Infineon Technologies AG, München (DE)

( * ) Notice: Subject to any disclaimer, the term of this patent is extended or adjusted under 35 U.S.C. 154(b) by 35 days.

(21) Appl. No.: 10/650,493

(22) Filed: Aug. 28, 2003

(65) Prior Publication Data

US 2004/0113828 A1 Jun. 17, 2004

(30) Foreign Application Priority Data

| Aug. 29, 2002 | (DE) | ................................. | 102 39 865 |
| Nov. 22, 2002 | (DE) | ................................. | 102 54 651 |
| Dec. 18, 2002 | (EP) | ................................. | 02028135 |

(51) Int. Cl.$^7$ .............................................. H03M 1/06
(52) U.S. Cl. ..................................................... 341/118
(58) Field of Search .............................. 341/118, 119, 341/120, 143

(56) References Cited

U.S. PATENT DOCUMENTS

| 4,251,803 | A | 2/1981 | Debord et al. |
| 5,117,234 | A | 5/1992 | Shizawa |
| 5,550,544 | A | 8/1996 | Sakiyama et al. |
| 5,805,093 | A | 9/1998 | Heikkilä |
| 5,896,101 | A | 4/1999 | Melanson |
| 5,907,299 | A | 5/1999 | Green et al. |
| 5,990,814 | A | 11/1999 | Croman et al. |
| 6,331,833 | B1 | 12/2001 | Naviasky et al. |
| 6,426,714 | B1 | 7/2002 | Ruha et al. |
| 6,653,958 | B1 * | 11/2003 | Morche ...................... 341/118 |

FOREIGN PATENT DOCUMENTS

| WO | WO 01/93430 | 12/2001 |
| WO | WO 02/09292 | 1/2002 |

OTHER PUBLICATIONS

European Search Report, Jun. 3, 2004.
Benabes et al., "A methodology for designing continuous-time sigma–delta modulators," *IEEE European Design and Test Conference*, 1997. (Abstract) (no month).
Cherry et al., "Continuous–Time Delta–Sigma Modulator for High Speed A/D Conversion," *Kluwar Academic Publisher*, pp. 75–103, 2000. (no month).
Gao et al., "Excess loop delay effects in continuous–time delta–sigma modulators and the compensation solution," *Circuits and Systems*, 1997. (Abstract) (no month).
Hernandez, L., "Continuous–time sigma–delta modulators with reduced timing jitter sensitivity based on time delays", *Electronics Letters*, Jul. 10, 2003. (Abstract).
Oliaei et al., "Jitter Effects in Continuous–Time Modulators with Delayed Return–to–Zero Feedback," *Electronics, Circuits and Systems*, pp. 351–354, 1998 (no month).
Ramesh et al., "Sigma delta analog to digital converters with adaptive quantization," *Circuits and Systems*, 1997. (Abstract) (no month).

* cited by examiner

*Primary Examiner*—Brian Young
(74) *Attorney, Agent, or Firm*—Jenkins, Wilson & Taylor, P.A.

(57) ABSTRACT

A quantizer for a sigma delta modulator comprising at least one preliminary stage V1, V2), the quantizer quantizing an input signal ($E_Q$) present at it in accordance with at least one threshold signal ($y_{th,i}$) and outputting it as a result value ($y_Q$) at a digital result output (OUT), wherein the quantizer has a number of comparators ($5_j$) corresponding to the number of threshold signals ($y_{th,j}$), which compare the input signal ($E_Q$) with the respective threshold signal ($y_{th,j}$), the threshold signal being reduced or increased by a correction voltage ($y_{dac3}$) or a correction current, the correction voltage or correction current being generated in accordance with the result value ($y_Q$) output at the result output (OUT).

17 Claims, 4 Drawing Sheets

SIGMA-DELTA-MODULATOR

TECHNICAL FIELD

The invention relates to a quantizer for a sigma delta modulator according to the preamble of Patent Claim 1.

BACKGROUND ART

In recent years, sigma delta modulation has gained increasing significance in the field of analog/digital (A/D) and digital/analog (D/A) conversion. This is mainly attributable to the low requirements for the analog components of signal converters. Digital circuits are gaining more and more significance in present day signal processing. To be able to convert the signals from the analog environment and then to be able to process them digitally, A/D converters are necessary. It is desirable to integrate converters and the remaining digital circuit on a single chip. Since the digital proportion in most cases dominates the chip area, it also determines the circuit technology. However, digital process technologies make it difficult to produce precise analog integrated circuit components in which very high accuracies and little manufacturing variation are demanded. This is where the simplicity and ruggedness of analog components of the sigma delta modulators become important, which predestine the sigma delta converters for implementations in, for example, digital VLSI technology.

A further advantage of the sigma delta modulators lies in the fact that they need less current than the conventional A/D converters, which also qualifies them in the important field of portable receivers. Similarly, they are distinguished by a higher signal bandwidth, which makes them interesting for application in xDSL transceiver technology.

The problem with sigma delta modulators is that errors occur due to propagation delays in the individual components (excess loop delay), especially toward higher frequencies to be converted, which limits their application to high frequencies (>1 GHz). With regard to the problems of excess loop delays, see also J. A. Cherry, W. M. Snelgrove, Continuous-Time Delta Sigma Modulator for High Speed A/D Conversion, Kluwer Academic Publishers 2000, pages 75–103.

A known approach to compensate for these errors induced by delay differences is the approach, known from P. Benabes, M. Keramat, R. Kielbasa, A methodology for designing continuous-time sigma-delta modulators, IEEE European Design and Test Conference 1997, pages 45–50, of introducing an additional feedback circuit (inner loop) which is formed by an additional adder between the quantizer and the last integrator preceding it.

FIG. 1 shows a conventional continuous-time second order sigma delta modulator with two preliminary stages $V_1$ and $V_2$ and with correction means. The signal x to be converted, which is present at the input IN, is supplied to the quantizer 2 at its input $E_Q$ via two integrators $4_1$ and $4_2$, each of which is in each case preceded by an adder $3_1$ and $3_2$, respectively, to link up with the feedback signal. Before that, however, the signal to be quantized is again combined with the feedback signal via the adder 10. This takes into consideration and compensates for the influence of the delay in the individual components.

FIG. 2 shows a possible conversion of such a concept known from W. Redman-White, A. M. Durham, A fourth order Converter with self-tuning Continuous Time Noise Shaper, from Proceedings of ESSCIRC 1991, pages 249–252.

In this concept, current AD converters $6_1$ to $6_2$ are used as digital/analog converters for the feedback signal $R_i$, the integrators $4_1$ and $4_2$ being formed by operational amplifiers and the compensation adder 10 also being constructed by an operational amplifier preceded by a current AD converter $6_3$. In this solution, the summing nodes $3_i$ are formed by the inputs of the operational amplifiers. The summing signals are the currents which flow through the input resistors and into the current generators in the respective feedback circuit.

FIG. 3 shows a diagram of a three-bit resolution sigma delta modulator constructed in this way in which seven threshold voltages are used.

According to the arrangement specified above, the sum is formed with the feedback signal before the quantizer. The comparators i=1 to N of the quantizer, therefore, must perform the weighting $$(V_2 - V_{dac3}) > V_{th,i}$$

(see also FIG. 4) where $V_2$ is the amount of the intermediate signal $y_2$ after the second integrator $4_2$.

The disadvantageous factor in this arrangement and procedure is, however, that a highly accurate active element (additional adder) must be provided in the signal path, with all the problems with regard to manufacturing methods and steps, layout design and waste in the manufacturing, and that the current consumption is considerably increased by this, which limits the fields of application especially in the case of portable applications which require current saving.

SUMMARY OF THE INVENTION

It is, therefore, the object of the invention to provide a sigma delta modulator with a quantizer in which the delays are compensated for by the individual components but no additional element is provided in the signal path.

This object is achieved by a quantizer having the features specified in Claim 1.

According to the invention, it is provided that the quantizer exhibits comparators in accordance with the number of threshold voltages, which compare the input signal with the respective threshold voltage, the threshold voltage being reduced or increased by a correction voltage which is generated in accordance with the result value output at the result output.

The invention proposes to adapt the threshold voltages for the comparators in the quantizer and no longer to adapt the signal to be quantized in the signal path before the quantizer as previously. This makes it possible to considerably simplify the design of the semiconductor circuit which also is no longer so critical in its manufacture since tolerances can be wider in this case than in the case of active analog elements directly in the signal path. The additional adder is dispensed with. The threshold voltage can be adapted over an entire clock cycle which is sufficient time. The entire system is more stable and, in addition, no longer produces so many delay errors since an active element has been removed from the signal path. This also reduces the current consumption of the sigma delta modulator and it can be implemented with less space required on a chip. In addition, higher sampling rates can be achieved since the sampling rate is increased due to the reduction in the delay errors. Applications in the XDSL field with the high sampling rates can be achieved more easily and the field of use of the sigma delta modulators is greater than was hitherto conceivable.

A preferred embodiment of the invention provides that a digital/analog converter is provided which generates an analog rough signal from the digital result value. This makes it possible to supply the individual adders in a simple manner with a feedback signal weighted with a factor.

Preferably, the rough signal is in each case multiplied by a predetermined factor to the respective feedback signal of a preliminary stage corresponding to the position and the number of preliminary stages in the signal path.

The correction voltage is advantageously a voltage corresponding to the result value multiplied by a fixed factor.

One embodiment of the invention provides that the factor is a simple fraction.

A preferred embodiment of the invention provides that a digital adder is provided which adds the factor to the result value and connects a previously generated threshold voltage, corresponding to the result, to the comparators.

A digital/analog converter is advantageously provided which generates the voltage corresponding to the result value.

According to an especially preferred embodiment of the invention, it is provided that the sigma delta modulator is of second order with two preliminary stages.

The sigma delta modulator is advantageously and, therefore, preferably a continuous-time sigma delta modulator.

Means for editing the output signals of the adder are preferably provided.

Advantageously, a number of comparators corresponding to the resolution of the quantizer is provided, the comparators exhibiting uniformly graduated threshold voltages.

Accordingly, it is provided, in accordance with one embodiment of the invention, that a reference voltage generator is provided which supplies part voltages from which the threshold voltages are generated.

Further advantages, special features and suitable developments of the invention are obtained from the further subclaims or their subcombinations.

BRIEF DESCRIPTION OF THE DRAWINGS

In the text which follows, the invention will be explained in further details with reference to the drawing, in which.

DETAILED DESCRIPTION OF THE INVENTION

Identical reference symbols in the figures designate identical or identically acting elements.

Figure 1:
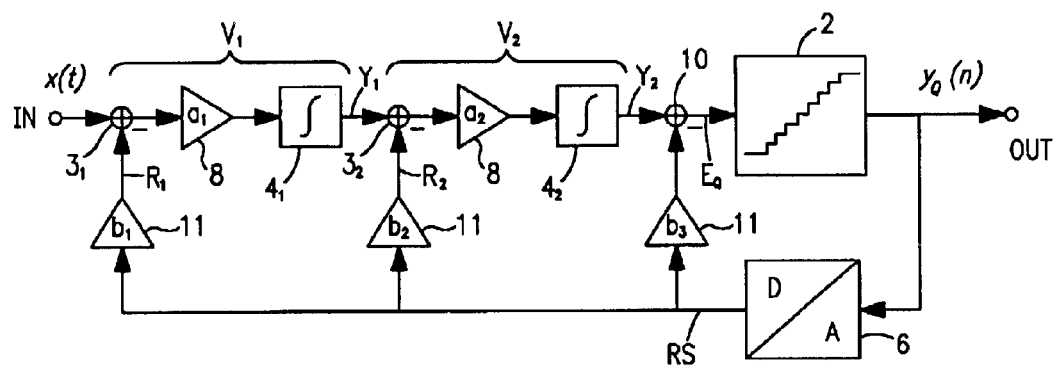
FIG. 1 shows a continuous-time sigma delta modulator according to the prior art.
Figure 2:
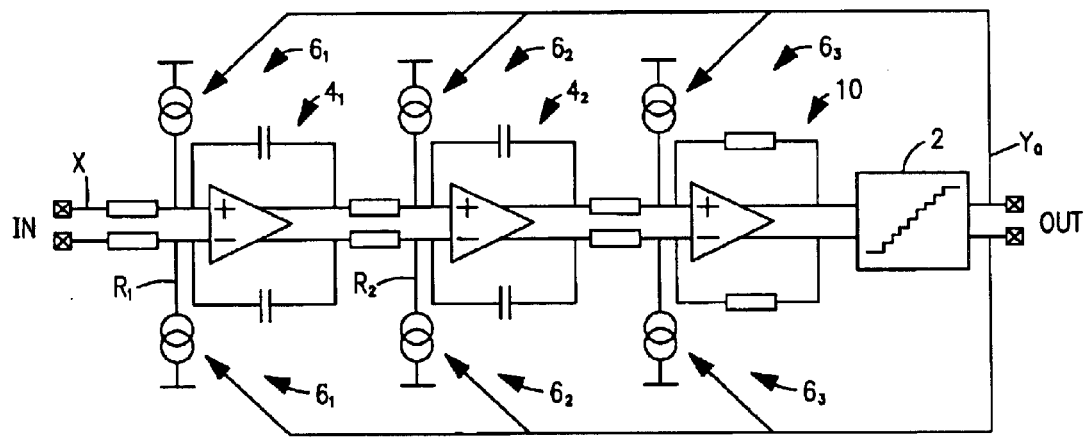
FIG. 2 shows an actual embodiment of the continuous-time sigma delta modulator from FIG. 1.
Figure 3:
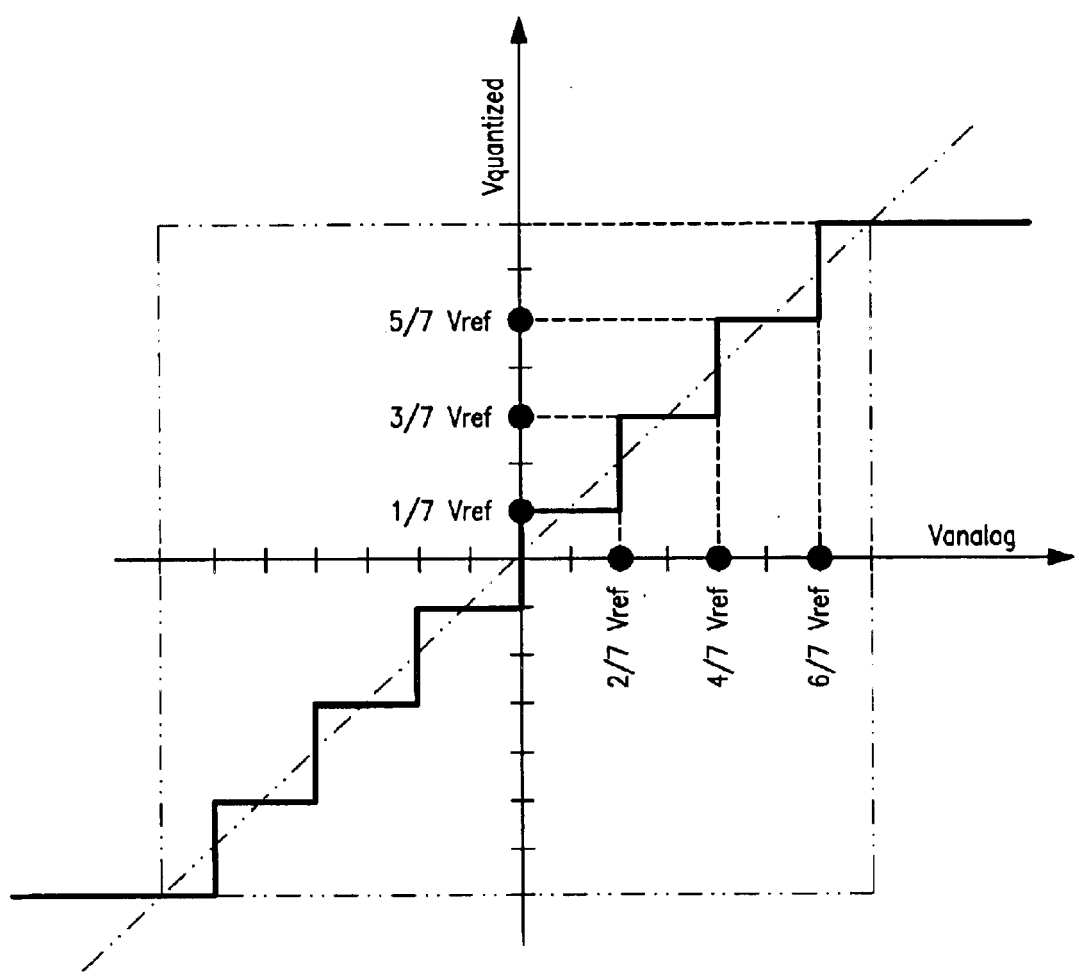
FIG. 3 shows a schematic diagram of the quantizing steps via the analog input voltage.
Figure 4:
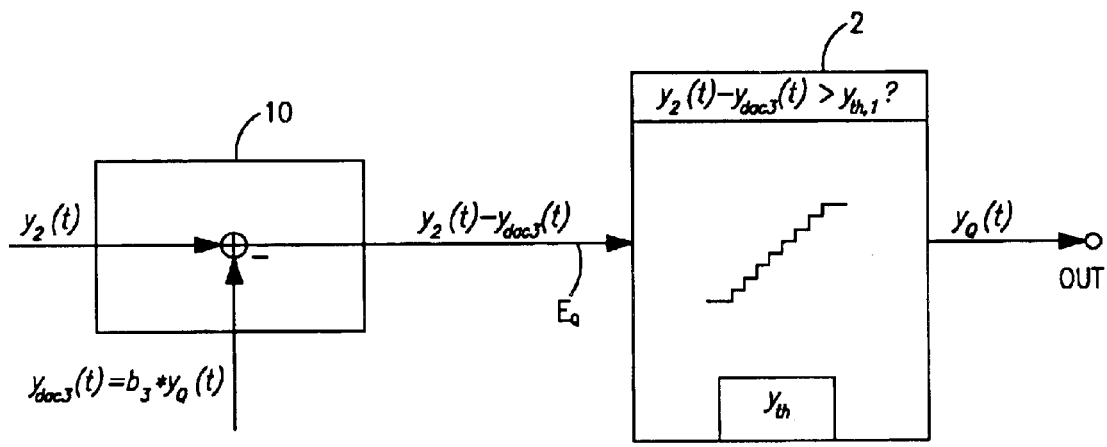
FIG. 4 shows a section from FIG. 1, the signals being shown clearly, FIG. 5 diagrammatically shows a quantizer according to the invention with the individual signals corresponding to the section from FIG. 4.
Figure 5:
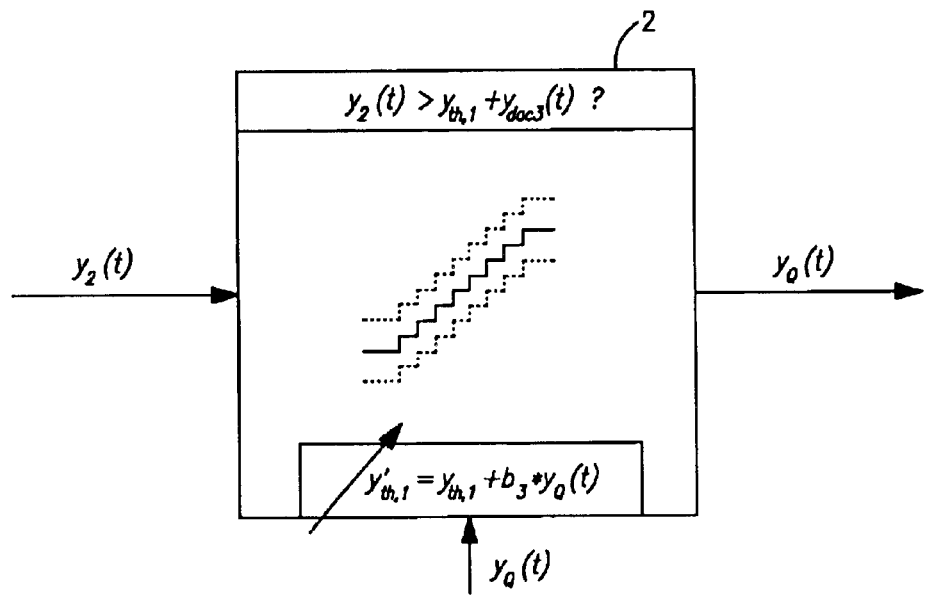

FIG. 5 clearly shows the difference from previously known approaches (see also FIG. 4). The comparators i=1 to N of the quantizers no longer need to perform the weighting $$(V_{Input} - V_{dac3}) > V_{th,i}$$

but $$V_{Input} > V_{th,i} + V_{dac3}.$$

Accordingly, there is no longer any need to shift the signal in the signal path before the comparators.

Which each clock cycle any comparator of the quantizer receives an adapted threshold voltage $$Y'_{th,i} = Y_{th,i} + Y_{dac3}(t)$$

The ramp voltage drawn as a continous line shows the adapted voltage. With a 3 bit quantizer eight shifted ramps should be drawn but have been omitted for sake of clarity.

The new principle is the summation of the feedback signal with the threshold voltages of the comparators.

A noncritical adaptation of the threshold voltages of the comparators in the quantizer is adequate. It is not necessary to convert the digital result $y_Q$ into a separate analog voltage. The values can be simply digitally added, followed by a corresponding connection of a reference voltage (see also FIG. 7).

Figure 6:
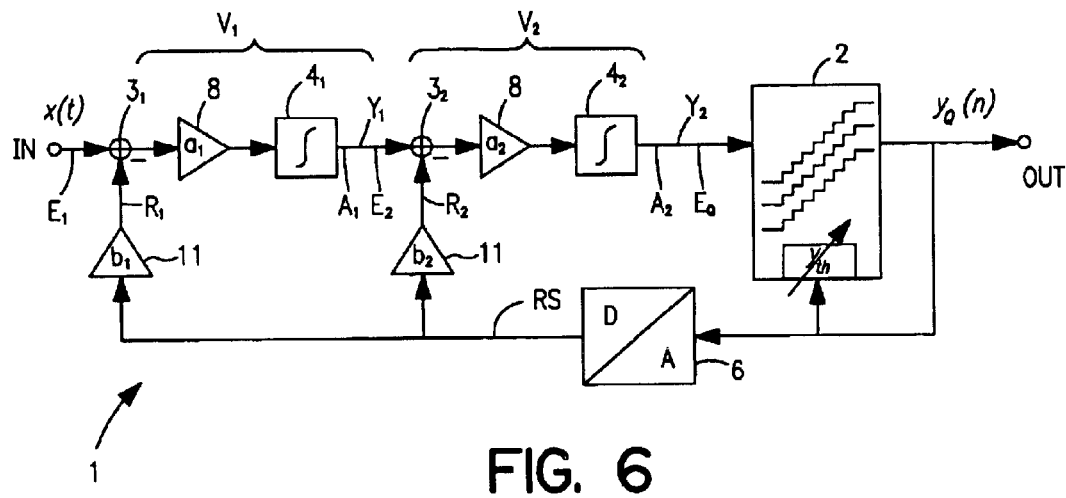
FIG. 6 shows a continuous-time sigma delta modulator according to the invention.

FIG. 6 shows the approach according to the invention.

Specifically, the threshold voltages $y_{th,i}$ can be summed with the correction voltage $y_{dac3}$ (=b3*$y_Q$) in a very simple manner since the factor $b_3$ is in most cases a simple fraction (for example ½, ¾, etc.). As a result, the threshold voltage $y_{th,i}$ can be fast and dynamic without having to intervene in the familiar and proven structures of the circuits supplying the threshold voltages. This applies both to the digital area and to the analog area, also including current or voltage reference.

The approach according to the invention no longer has any fixed threshold voltages $y_{th,i}$ but adapts them in each case by the current correction voltage $y_{dac3}$=b3*$y_Q$.

[lacuna] drawn ramp voltage is to illustrate the adapted voltage. In the case of a three-bit quantizer, eight shifted ramps should actually be drawn but were omitted in order to retain clarity.

The new principle is the summation of the feedback signal with the threshold voltages of the comparators.

A noncritical adaptation of the threshold voltages of the comparators in the quantizer is adequate. It is not necessary to convert the digital result $y_Q$ into a separate analog voltage. The values can be simply digitally added, followed by a corresponding connection of a reference voltage (see also FIG. 7).

FIG. 6 shows the approach according to the invention.

Specifically, the threshold voltages $y_{th,i}$ can be summed with the correction voltage $y_{dac3}$ (=b3*$y_Q$) in a very simple manner since the factor $b_3$ is in most cases a simple fraction (for example ½, ¾, etc.) . As a result, the threshold voltage $y_{th,i}$ can be fast and dynamic without having to intervene in the familiar and proven structures of the circuits supplying the threshold voltages. This applies both to the digital area and to the analog area, also including current or voltage reference.

The approach according to the invention no longer has any fixed threshold voltages $y_{th,i}$ but adapts them in each case by the current correction voltage $y_{dac3}$=b3*$y_Q$.

Figure 7:
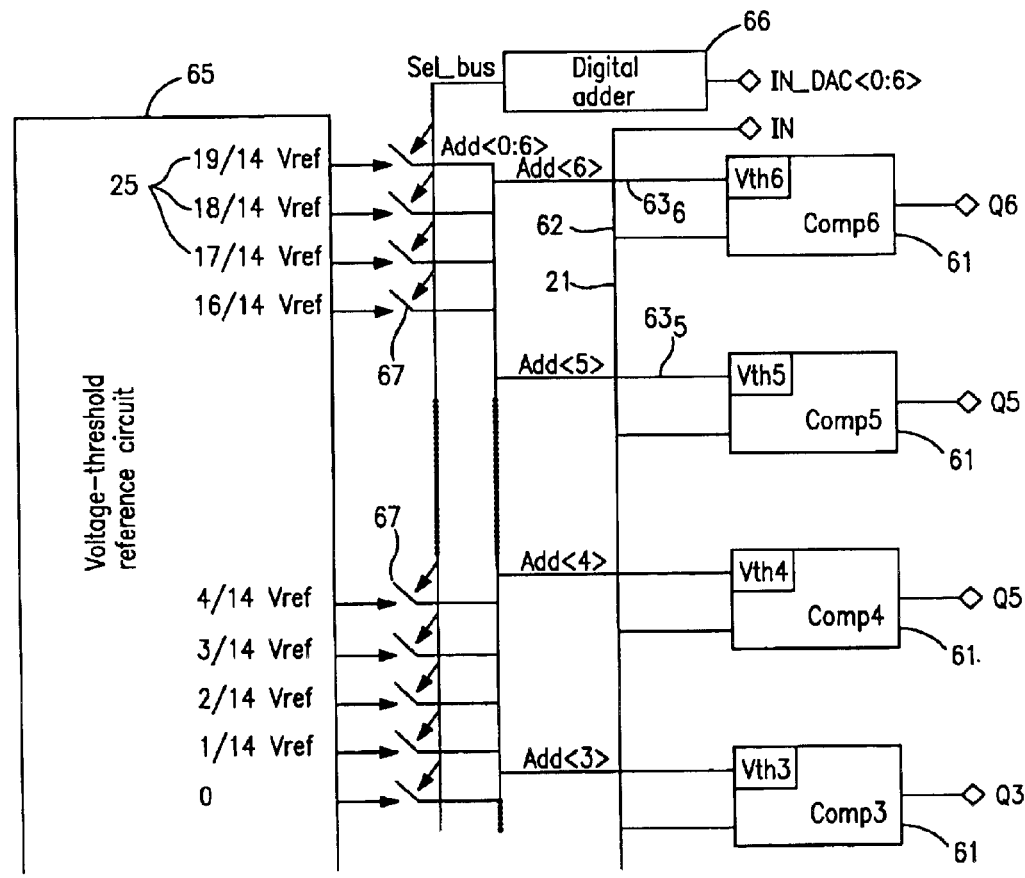
FIG. 7 shows a diagrammatic representation of a more specific configuration of a quantizer according to the invention.

FIG. 7 diagrammatically shows an implementation of a preferred embodiment of the quantizer 2 for a sigma delta modulator 1 with $b_3$=½ and eight thresholds, in which the addition of the feedback value IN_DAC<0:6> is already performed in the purely digital domain. This does not require a digital/analog converter. The part reference voltages x * Vref are generated, for example, by a chain of resistors.

A digital adder 66 is provided which adds the digital result value IN_DAC<0:6> to the last weighting of the comparators 61 of the quantizer to the threshold signal voltages by increasing or reducing the threshold signal voltages $63_i$ by steps corresponding to the digital result value. For this purpose, switches 67 are opened or closed correspondingly.

The adaptation to the delay differences by means of the factor $b_3$ can take place in the adder 66 itself which, in accordance with the result of the addition with the feedback value IN_DAC<0:6> (result of the previous weighting of the quantizer), connects the corresponding threshold voltages $Vth_i$ by means of the switches 67 to the individual inputs of the comparators 61 which then carry out the weighting with the input signal 62 (IN) to the respective result bit Qi.

The quantizer 2 has a number of comparators 61 corresponding to the number of its resolution intervals.

The comparators 61 compare the input signal voltage 62 (IN) with in each case their threshold signal voltage $63_i$ and, if the input signal exceeds or drops below the threshold signal, a corresponding digital result bit (0/1) (Qi) is output.

To generate the various threshold signal voltages $63_i$, a reference voltage generator 65 is provided which supplies a separate threshold signal voltage $63_i$ to each voltage comparator 61 via the switches 67 in accordance with the output data Add<0:6> of the adder 66. The differences of the individual threshold signal voltages $63_i$ remains the same but, in accordance with the result Add<0:6> of the adder 66, the voltage level of each threshold signal voltage $63_i$ is increased or lowered in accordance with the result IN_DAC<0:6> of the previous weighting of the quantizer.

In accordance with the result of the summation, therefore, part voltages $\frac{1}{14}$*Vref, $\frac{2}{14}$*Vref, . . . are added to the threshold voltage $V_{th}$ by opening and closing switches and are connected to the comparators 61. In the example shown and in the text which follows, a 3-bit quantizer with seven steps is shown in which $b_3=\frac{1}{2}$ is selected. However, other values and resolutions can also be implemented depending on the application.

The seven threshold voltages of the comparators are, therefore, no longer fixed with respect to Vref and to the previously fixed basic voltages (with respect to Vref)

$+\frac{12}{14}, +\frac{8}{14}, +\frac{4}{14}, 0, -\frac{4}{14}, -\frac{8}{14}, -\frac{12}{14}$ One of the following values is added to all threshold voltages with each clock cycle in accordance with the actual and current value of the result value from the digital adder 66:

$+\frac{7}{14}, +\frac{5}{14}, +\frac{3}{14}, +\frac{1}{14}, -\frac{1}{14}, -\frac{3}{14}, -\frac{5}{14}, -\frac{7}{14}$ The resultant seven signals are compared with the current input signal, to be weighted, of the quantizer by the comparators as a result of which the next digital result is generated.

The arrangement of the comparators and the comparators themselves can also be formed symmetrically with a positive and a negative signal path.

List of Reference Symbols

1 Sigma delta modulator
2 Quantizer
$3_i$ Adder
$4_i$ Integrator
$5_i$, 61 Comparators
6 Digital/analog converter
7,66 Digital adders
8 Amplifier
9 Reference voltage generator
10 Compensation adder
11 Multiplier
62 Input signal
$63_i$ Threshold signal voltage
67 Voltage switch
IN Signal input
OUT Result output
x Evaluation signal
$y_Q$ Result value
$y_1, y_2$ Intermediate signals
EQ Input signal
$y_{th,i}$, $63_i$ Threshold voltage
$y_{dac3}$ Correction voltage
$V_i$ Preliminary stage
$E_i$ Preliminary stage input signal
$A_i$ Preliminary stage output signal
$R_i$ Feedback signal
RS Rough signal
$b_3$ Factor
Qi Result bit

What is claimed is:

1. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein a number of comparators corresponding to the resolution of the quantizer is provided, the comparators having uniformly graduated threshold voltages or threshold currents.

2. The quantizer as claimed in claim 1, wherein a reference voltage generator is provided which generates the threshold signal voltages, which are different for each voltage comparator, the threshold signal voltages being selectable in part voltages, the threshold signal exhibiting, in particular, fixed differences with respect to one another.

3. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein an adder is associated with a switching mechanism which has switches at the inputs of which the part voltages of the reference voltage generator are present and the outputs of which are connected to the inputs for the threshold signal voltages of the comparators, the switches being controlled by the output signal of the adder.

4. A sigma delta modulator comprising a quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output.

5. A sigma delta modulator comprising a signal input at which an evaluation signal to be evaluated is present, and a digital result output which outputs a digital result value, a quantizer being provided which quantizes an input signal is accordance with at least one threshold voltage and outputs a result value at the digital result output, the quantizer being preceded at its input by at least one preliminary stage, which comprises an adder, processing a preliminary stage input signal with an integrator following the adder in the signal path and supplying a preliminary stage output signal, the adder being supplied with a feedback signal, generated in dependence on the result value for addition to the preliminary stage input signal, the evaluation signal being present as preliminary stage input signal at a first preliminary stage and the preliminary stage output signal of the in each case previous preliminary stage in the signal path being present as preliminary stage input signal at each further preliminary stage, the last preliminary stage before the quantizer supplying the input signal to the quantizer as preliminary stage output signal, wherein the quantizer exhibits a number of comparators corresponding to the number of threshold voltages, which compare the input signal with the respective threshold voltage, the threshold voltage being reduced or increased by a correction voltage, the correction voltage being generated in accordance with the result value output at the result output.

6. The sigma delta modulator as claimed in claim 5, wherein a digital/analog converter is provided which generates an analog rough signal from the digital result value.

7. The sigma delta modulator as claimed in claim 5, wherein the correction voltage is a voltage corresponding to the result value multiplied by a fixed factor.

8. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein a digital/analog converter is provided which generates the voltage corresponding to the result value.

9. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein a digital adder is provided which adds the factor to the result value and connects a previously generated threshold voltage, corresponding to the result, to the comparators.

10. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein the sigma delta modulator is of second order with two preliminary stages.

11. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein the sigma delta modulator is a continuous-time sigma delta modulator.

12. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein a device for editing the output signals of the adder is provided.

13. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein a number of comparators corresponding to the resolution of the quantizer is provided, the comparators exhibiting uniformly graduated threshold voltages.

14. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein a reference voltage generator is provided which supplies part voltages, from which the threshold voltages are generated.

15. A quantizer for a sigma delta modulator comprising at least one preliminary stage, the quantizer quantizing an input signal in accordance with at least one threshold signal and outputting a result value at a digital result output, wherein the quantizer has a number of comparators corresponding to the number of threshold signals, which compare the input signal with the respective threshold signal, the threshold signal being reduced or increased by a correction voltage or a correction current, the correction voltage or correction current being generated in accordance with the result value output as the result output, wherein a number of comparators corresponding to the resolution of the quantizer is provided, the comparators having uniformly graduated threshold voltages or threshold currents, and wherein the quantizer has a number of voltage comparators corresponding to the number of its resolution intervals, the voltage comparators comparing the input signal present as input signal voltage with an associated threshold signal voltage and, if the input signal voltage exceeds or drops below the threshold signal voltage, outputting a corresponding digital result bit (0/1), a digital adder being provided which adds the digital result value of the last weighting of the comparators of the quantizer to the individual threshold signal voltages of the comparators by increasing or reducing the threshold signal voltages by part voltages corresponding to the digital result value.

16. A sigma delta modulator comprising a signal input at which an evaluation signal to be evaluated is present, and a digital result output which outputs a digital result value, a quantizer being provided which quantizes an input signal is accordance with at least one threshold voltage and outputs a result value at the digital result output, the quantizer being preceded at its input by at least one preliminary stage, which comprises an adder, processing a preliminary stage input signal with an integrator following the adder in the signal path and supplying a preliminary stage output signal, the adder being supplied with a feedback signal, generated in dependence on the result value for addition to the preliminary stage input signal, the evaluation signal being present as preliminary stage input signal at a first preliminary stage and the preliminary stage output signal of the in each case previous preliminary stage in the signal path being present as preliminary stage input signal at each further preliminary stage, the last preliminary stage before the quantizer supplying the input signal to the quantizer as preliminary stage output signal, wherein the quantizer exhibits a number of comparators corresponding to the number of threshold voltages, which compare the input signal with the respective threshold voltage, the threshold voltage being reduced or increased by a correction voltage, the correction voltage being generated in accordance with the result value output at the result output, wherein a digital/analog converter is provided which generates an analog rough signal from the digital result value, and wherein the rough signal is in each case multiplied by a predetermined factor to the respective feedback signal of a preliminary stage corresponding to the position and the number of preliminary stages in the signal path.

17. A sigma delta modulator comprising a signal input at which an evaluation signal to be evaluated is present, and a digital result output which outputs a digital result value, a quantizer being provided which quantizes an input signal is accordance with at least one threshold voltage and outputs a result value at the digital result output, the quantizer being preceded at its input by at least one preliminary stage, which comprises an adder, processing a preliminary stage input signal with an integrator following the adder in the signal path and supplying a preliminary stage output signal, the adder being supplied with a feedback signal, generated in dependence on the result value for addition to the preliminary stage input signal, the evaluation signal being present as preliminary stage input signal at a first preliminary stage and the preliminary stage output signal of the in each case previous preliminary stage in the signal path being present as preliminary stage input signal at each further preliminary stage, the last preliminary stage before the quantizer supplying the input signal to the quantizer as preliminary stage output signal, wherein the quantizer exhibits a number of comparators corresponding to the number of threshold voltages, which compare the input signal with the respective threshold voltage, the threshold voltage being reduced or increased by a correction voltage, the correction voltage being generated in accordance with the result value output at the result output, wherein the correction voltage is a voltage corresponding to the result value multiplied by a fixed factor, and wherein the factor is a simple fraction.

* * * * *